(12) United States Patent
Ogawa

(10) Patent No.: US 11,474,914 B2
(45) Date of Patent: Oct. 18, 2022

(54) CIRCUIT DEVICE, DISPLAY CONTROL SYSTEM, ELECTRONIC APPARATUS, AND MOBILE UNIT FOR SECURING RELIABILITY OF IMAGE DATA

(71) Applicant: SEIKO EPSON CORPORATION, Tokyo (JP)

(72) Inventor: Hideki Ogawa, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 539 days.

(21) Appl. No.: 16/536,438

(22) Filed: Aug. 9, 2019

(65) Prior Publication Data

US 2020/0050520 A1 Feb. 13, 2020

(30) Foreign Application Priority Data

Aug. 10, 2018 (JP) .............................. JP2018-151830

(51) Int. Cl.
  *G06F 11/16* (2006.01)
  *G06F 11/07* (2006.01)
  *H03M 13/09* (2006.01)

(52) U.S. Cl.
  CPC ...... *G06F 11/1629* (2013.01); *G06F 11/0721* (2013.01); *H03M 13/09* (2013.01); *G09G 2330/12* (2013.01)

(58) Field of Classification Search
  CPC .. G06F 11/08; G06F 11/1629; G06F 11/0721; H03M 13/09; G09G 2330/12
  See application file for complete search history.

(56) References Cited

U.S. PATENT DOCUMENTS

| 5,990,852 A * | 11/1999 | Szamrej .............. H04N 19/507 345/2.1 |
| 2005/0276514 A1 | 12/2005 | Fisher |
| 2007/0078922 A1 | 4/2007 | Sano et al. |
| 2012/0036418 A1 | 2/2012 | Morino et al. |
| 2015/0281742 A1* | 10/2015 | Staudenmaier ........ H04N 19/89 375/240.27 |
| 2018/0240397 A1* | 8/2018 | Hara ....................... G09G 3/30 |
| 2019/0013826 A1 | 1/2019 | Kikuta et al. |
| 2019/0266711 A1* | 8/2019 | Anand ..................... G06T 7/13 |
| 2020/0126508 A1* | 4/2020 | Kim ....................... G09G 5/006 |

FOREIGN PATENT DOCUMENTS

| JP | 2007-101691 A | 4/2007 | |
| JP | 2012-035677 A | 2/2012 | |
| JP | 2018-072460 A | 5/2018 | |
| WO | WO-2007093199 A2 * | 8/2007 | ............. G06T 7/194 |
| WO | WO-2017104346 A1 * | 6/2017 | ............... G09G 5/00 |

\* cited by examiner

*Primary Examiner* — Matthew M Kim
*Assistant Examiner* — Indranil Chowdhury
(74) *Attorney, Agent, or Firm* — Rankin, Hill & Clark LLP

(57) ABSTRACT

A circuit device 100 includes an interface circuit 160 that receives image data and information for image check and a processing circuit 105 that performs image check processing. The information for image check includes information for designating an image check method for a region to be subjected to image check and position information of the region to be subjected to image check. The processing circuit 105 performs the image check processing on the image data of the region to be subjected to image check specified by the position information, using the image check method designated by the designation information.

17 Claims, 9 Drawing Sheets

CIRCUIT DEVICE, DISPLAY CONTROL SYSTEM, ELECTRONIC APPARATUS, AND MOBILE UNIT FOR SECURING RELIABILITY OF IMAGE DATA

The present application is based on, and claims priority from JP Application Serial Number 2018-151830, filed Aug. 10, 2018, the disclosure of which is hereby incorporated by reference herein in its entirety.

BACKGROUND

1. Technical Field

The present disclosure relates to a circuit device, a display control system, an electronic apparatus, a mobile unit, and the like.

2. Related Art

In display control of display devices, a processing device such as a CPU transmits image data and a control signal to a display controller, the display controller performs image processing and generates a timing signal, and a display driver operates based on the image data that underwent the image processing and the timing signal. For transmission of image data from the processing device to the display controller, an LVDS (low voltage differential signal) method, an RGB serial method, or the like is used, but there are cases where a failure occurs in the image data during communication thereof due to a communication error and the like. For example, JP-A-2012-35677 and JP-A-2007-101691 disclose a technique for checking image data received from a processing device by a display controller, through CRC (cyclic redundancy check). In addition, JP-A-2018-72460 discloses a technique for checking image data regarding a region provided within a valid image area. In JP-A-2018-72460, region information and a CRC expectation value are added before the valid image area of a display region or a non-display region, and image data is checked based on the region information and the CRC expectation value.

JP-A-2012-35677, JP-A-2007-101691, and JP-A-2018-72460 are examples of the related art.

In the existing techniques of JP-A-2012-35677, JP-A-2007-101691, and JP-A-2018-72460 described above, the check method of image data is CRC only. Therefore, both the processing device that transmits image data and a circuit device that receives the image data need to perform CRC calculation. CRC calculation is a measure effective for securing the reliability of image data, but there is an issue that the processing loads of these devices increase.

SUMMARY

An aspect of the present disclosure pertains to a circuit device that includes an interface circuit that receives image data and information for image check and a processing circuit that performs image check processing, the information for image check including information for designating an image check method for a region to be subjected to image check and position information of the region to be subjected to image check, and the processing circuit performing the image check processing on the image data of the region to be subjected to image check specified by the position information, using the image check method designated by the designation information.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Preferred embodiments of the disclosure will be described below in detail. It is to be noted that the embodiments described below are not intended to unduly limit the scope of the disclosure recited in the appended claims, and not all configurations described in the embodiments are necessarily essential to the solving means of the disclosure.

1. Display Control System

Figure 1:
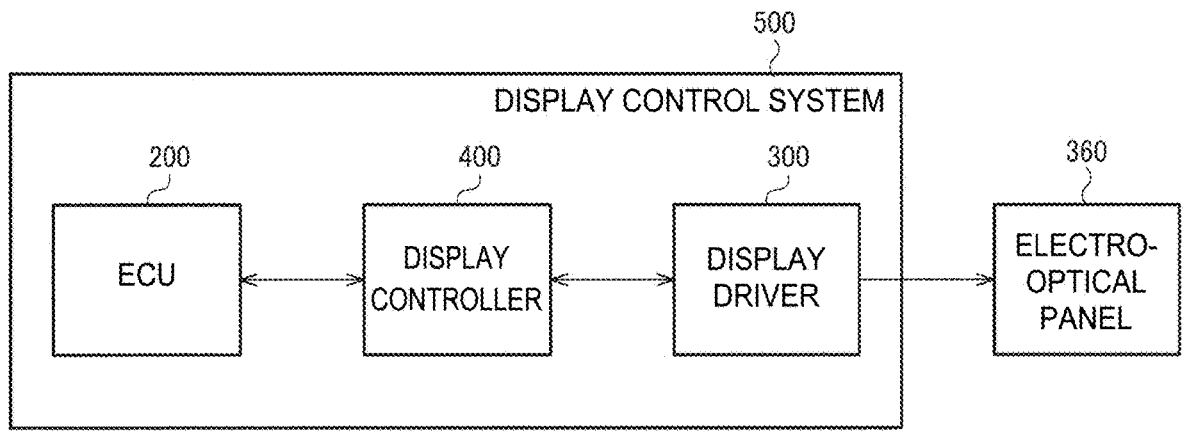
FIG. 1 shows a configuration example of a display control system.

FIG. 1 shows a configuration example of a display control system 500 to which a circuit device of the present embodiment can be applied. The display control system 500 includes an ECU (electronic control unit) 200, a display controller 400, and a display driver 300. The display control system 500 and an electro-optical panel 360 constitute a display system.

The ECU 200 transmits image data to the display controller 400. The display controller 400 receives image data from the ECU 200, and processes this image data. The display controller 400 outputs the processed image data and a timing control signal to the display driver 300. The timing control signal is a synchronization signal, a pixel clock signal, or the like. The display driver 300 receives the image data and the timing control signal from the display controller 400, and drives the electro-optical panel 360 based on the image data and the timing control signal. Accordingly, an image corresponding to the image data is displayed on the electro-optical panel 360. Note that the ECU 200 may be a processor such as a CPU (central processing unit) or a microcomputer. The display controller 400 and the display driver 300 are integrated circuit devices, for example. The electro-optical panel 360 may be a liquid crystal display panel, an EL (electro luminescence) panel, or the like.

In the present embodiment, a processing device transmits image data to a circuit device, and the circuit device performs image check processing on the received image data. In the display control system 500 in FIG. 1, the circuit device that performs image check processing can be the display controller 400 or the display driver 300. Accordingly, in the first embodiment, the ECU 200, which is a processing device, transmits image data to the display controller 400, which is a circuit device, and the display controller 400 performs image check processing on the received image data. Alternatively, in a second embodiment, the display controller 400, which is a processing device, transmits image data to the display driver 300, which is a circuit device, and the display driver 300 performs image check processing on the received image data. These first and second embodiments will be described below.

2. First Embodiment

Figure 2:
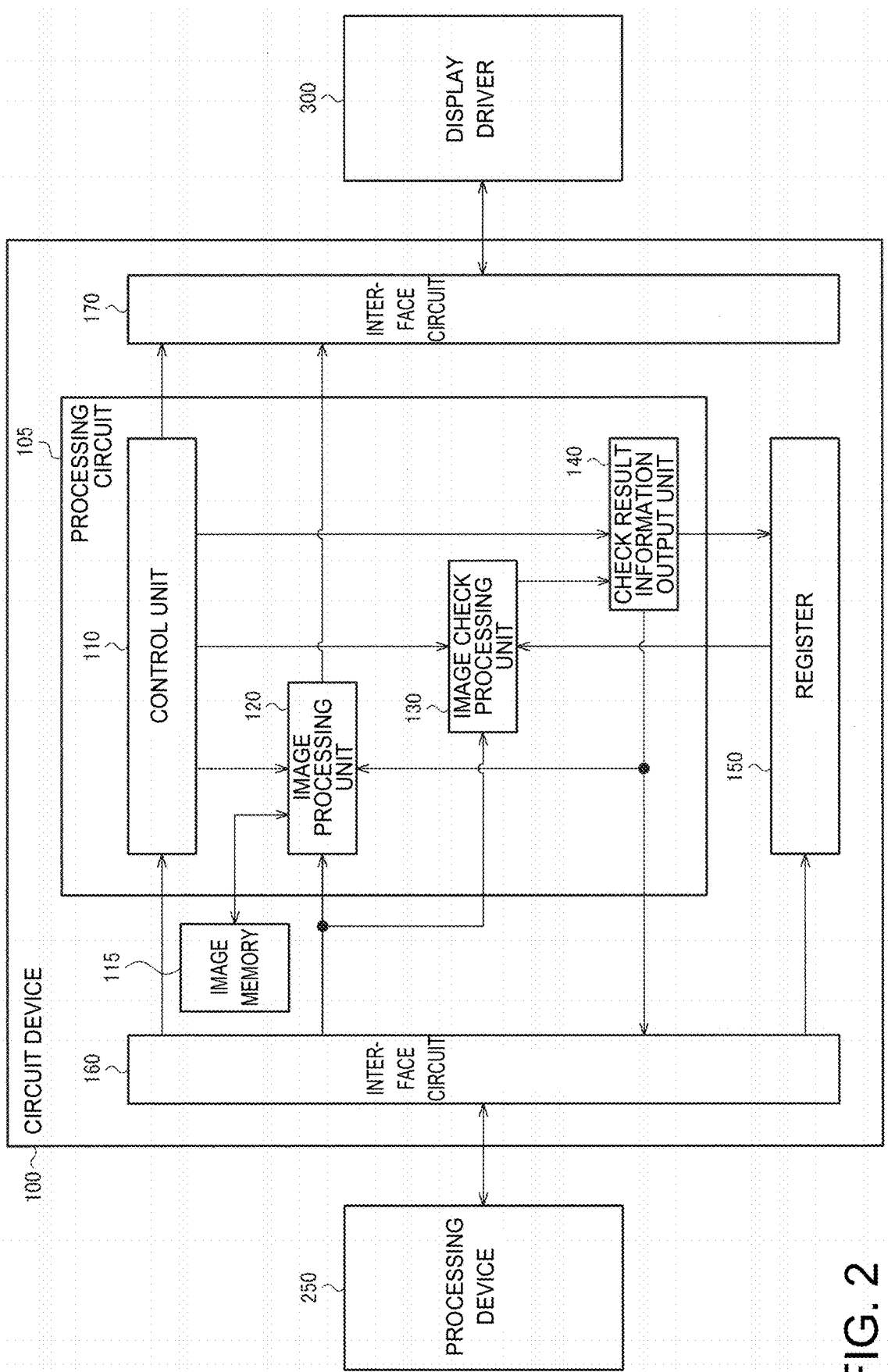
FIG. 2 shows a configuration example of a circuit device in a first embodiment.

FIG. 2 shows a configuration example of a circuit device 100 in the first embodiment. In the first embodiment, the circuit device 100 is a display controller. When the circuit device 100 is installed in an automobile or the like, a processing device 250 is an ECU, and when the circuit device 100 is installed in an electronic apparatus such as an information communication terminal, the processing device 250 is a processor.

As shown in FIG. 2, the circuit device 100 includes a processing circuit 105, an image memory 115, a register 150, an interface circuit 160, and an interface circuit 170. The processing circuit 105 includes a control unit 110, an image processing unit 120, an image check processing unit 130, and a check result information output unit 140. The circuit device 100 is an integrated circuit device, for example.

The interface circuit 160 performs communication between the processing device 250 and the circuit device 100. For example, the interface circuit 160 receives image data that is being transmitted from the processing device 250 to the image processing unit 120, and receives a timing control signal that is being transmitted from the processing device 250 to the control unit 110. The timing control signal is a clock signal, a vertical synchronization signal, a horizontal synchronization signal, a data enable signal, or the like. In addition, data may be written from the processing device 250 to the register 150. In that case, the interface circuit 160 receives a register value from the processing device 250, and stores the register value to the register 150. In addition, the interface circuit 160 transmits check result information that is output by the check result information output unit 140, to the processing device 250. The check result information is, for example, an error detection signal indicating that an error has been detected, or error detection region information indicating a region in which an error has been detected. In addition, upon receiving a readout command from the processing device 250, the interface circuit 160 reads out a register value from the register 150, and transmits the register value to the processing device 250.

An LVDS (low voltage differential signal) method, an RGB serial method, a transmission method of a display port standard, or the like can be adopted as the communication method of image data and a timing control signal. In addition, an I2C (inter integrated circuit) method, an SPI (serial peripheral interface) method, or the like can be adopted as the communication method of check result information and a register value. The interface circuit 160 can include an input/output buffer circuit and a control circuit for realizing these communication methods. The control circuit is a PLL circuit or the like, as with the case of the LVDS method.

The processing device 250 transmits image data, information for image check, and data for image check to the interface circuit 160. The information for image check and the data for image check are transmitted using a communication method same as that for the image data. Accordingly, a vertical synchronization signal and data of one frame defined by the vertical synchronization signal include image data, information for image check, and data for image check. The image data is image data of an image displayed in one frame of display. The information for image check includes information for designating a target region to be subjected to image check, information for designating an image check method that is applied to the target region, and information for designating a position at which the data for image check is stored. The data for image check is an expectation value that is used for image check processing. For example, if ECC is used as the image check method, the expectation value is a code for correcting an error in the image data. Alternatively, if CRC or checksum is used as the image check method, the expectation value is a CRC calculation value or a checksum calculation value. Alternatively, if a fixed data technique is used as the image check method, the expectation value is fixed data (which is fixed and does not change) that does not depend on the image data. An image check method is designated, for example, in accordance with the degree of importance of an image arranged in its region, and the like. For example, in an on-board apparatus and the like, an image check method for a region in which an icon is displayed is designated in accordance with the degree of importance of the icon.

The control unit 110 performs control of the units of the circuit device 100. Specifically, the control unit 110 performs timing control of the units of the circuit device 100 based on a timing control signal from the processing device 250. The control unit 110 also generates a timing control signal that is transmitted to the display driver 300.

The image processing unit 120 performs various types of image processing and data shaping processing on image data from the processing device 250. The image processing is tone correction and the like. The data shaping processing is, for example, processing for generating transmission data adopted to a data reception method of the display driver 300.

Image data, information for image check, and data for image check received by the interface circuit 160 are input to the image check processing unit 130. The image check processing unit 130 performs image check processing using these. Specifically, a target region and an image check method are designated by the information for image check. The image check processing unit 130 performs image check processing on the image data of the target region, using the designated image check method. Image check processing for each check method will be described later.

The check result information output unit 140 outputs check result information based on the result of image check processing. The check result information is, for example, an error detection signal indicating that an error has been detected in the target region. The check result information output unit 140 outputs an error detection signal to the interface circuit 160, and the interface circuit 160 transmits the error detection signal to the processing device 250. Alternately, the check result information output unit 140 outputs, as an interruption request signal, an error detection signal from a terminal (not illustrated) to the processing device 250. Alternatively, the check result information output unit 140 stores the error detection signal to the register 150, and the processing device 250 reads out the error detection signal from the register 150 via the interface circuit 160. Alternatively, the check result information may also be a value calculated from the image data of the target region. The calculated value is a CRC calculated value or a checksum calculated value. The check result information output unit 140 outputs the calculated value to the interface circuit 160, and the interface circuit 160 outputs the calculated value to the processing device 250. Alternatively, the check result information output unit 140 stores the calculated value to the register 150, and the processing device 250 reads out the calculated value from the register 150 via the interface circuit 160. The processing device 250 performs error detection by comparing the calculated value that has been read out and the expectation value.

If a plurality of target regions are set in one image, the image check processing unit 130 performs image check processing on respective pieces of image data of the target regions. The check result information output unit 140 outputs check result information for each target region. In this case, the processing device 250 is notified of a target region in which an error occurred. Alternatively, if the check result information is an error detection signal, the check result information output unit 140 may output a logical sum of error detection signals of the plurality of target regions. In this case, the processing device 250 is notified that an error occurred in one of the plurality of target regions.

The interface circuit 170 performs communication between the circuit device 100 and the display driver 300. For example, the interface circuit 170 transmits image data that is output by the image processing unit 120, to the display driver 300, and transmits a timing control signal output by the control unit 110, to the display driver 300. In addition, the interface circuit 170 may also transmit, to the display driver 300, a setting signal for setting an operation of the display driver 300. A communication method that is same as that of the interface circuit 160 can be adopted.

Note that the display driver 300 drives an electro-optical panel based on image data and a timing control signal received from the circuit device 100. For example, the display driver 300 includes a data driver that drives data lines of the display panel, a scanning driver that drives scanning lines of the display panel, a control circuit that controls these drivers, a power supply circuit that supplies a power supply voltage or a reference voltage to the units of the display driver 300, and the like.

The processing circuit 105 is constituted by a logic circuit. The logic circuit is, for example, a gate array circuit or a standard cell array circuit. As used herein, the gate array circuit refers to an array circuit in which logic cells are automatically placed and signal lines are automatically routed. Also, in a standard cell array circuit, the logic cells are standardized cells. The standard cell array circuit refers to an array circuit in which signal lines are automatically routed in a logic cell array.

Alternatively, processing that is performed by a processing circuit 310 may be realized by software. In this case, by a processor such as a DSP (digital signal processor) executing a program, the processing circuit 310 is realized. Specifically, a program stored in a non-transitory information storage medium is read out, and the read program is executed by the processor. Here, the information storage medium refers to a computer-readable medium, and stores programs, data, and the like. The function of the information storage medium is realized by an optical disk, a hard disk drive, a memory, or the like. Moreover, the processor performs various types of processing in the present embodiment based on a program stored in the information storage medium. Accordingly, the information storage medium stores programs for allowing a computer to function as the units of the processing circuit 105. The computer is a device provided with an operation unit, a processing unit, a storage unit, and an output unit.

Next, image check processing in each check method will be described. The image check processing is processing for checking whether or not image data has been properly transferred on a communication path from the processing device 250 to the circuit device 100. Specifically, the image check processing is processing for correcting an error in image data received by the interface circuit 160, or processing for checking whether or not there is an error in image data received by the interface circuit 160.

If the image check method is ECC, the image processing unit 120 stores image data received by the interface circuit 160, to the image memory 115. The image check processing unit 130 performs error correction processing on image data of a target region, using a code for correcting an error in the image data. The image check processing unit 130 outputs the image data that underwent error correction processing and an error detection signal to the check result information output unit 140. The error detection signal in this case is a signal indicating whether or not correction occurred in the error correction processing. If correction occurred, it is conceivable that an error has been detected in the image data of the target region. The check result information output unit 140 outputs the error detection signal to the interface circuit 160 or the register 150. The check result information output unit 140 also outputs the image data that underwent error correction processing, to the image processing unit 120. The image processing unit 120 corrects the image data of the target region in the image data read out from the image memory 115, using the image data that underwent error correction processing. The image processing unit 120 outputs the corrected image data to the interface circuit 170.

If the image check method is CRC, the image check processing unit 130 obtains comparison data from image data of a target region through CRC calculation, compares the comparison data with an expectation value, and thereby performs error detection. If the comparison data and the expectation value do not match, the image check processing unit 130 determines that there is an error in the image data of the target region. The image check processing unit 130 outputs an error detection signal or a CRC calculation value to the interface circuit 160 or the register 150.

If the image check method is checksum, the image check processing unit 130 obtains comparison data from image data of a target region through checksum calculation, compares the comparison data with an expectation value, and thereby performs error detection. If the comparison data and the expectation value do not match, the image check processing unit 130 determines that there is an error in the image data of the target region. The image check processing unit 130 outputs an error detection signal or a checksum calculation value to the interface circuit 160 or the register 150.

If the image check method is a fixed data method, fixed data is input as an expectation value to the image check processing unit 130. The image check processing unit 130 compares comparison data, which is the same data as the fixed data, with the expectation value. The comparison data is incorporated in the image check processing unit 130, as a logic circuit, or is stored in a non-volatile memory (not illustrated) or the like. If the comparison data and the expectation value do not match, the image check processing unit 130 determines that there is an error in the image data of the target region. A target region in the case of the fixed data method is an image region that is arranged before the position at which the fixed data is stored, in received data of one frame. For example, if fixed data is added after image data of one frame, the target region is the one frame. Alternatively, if fixed data is added after image data for one horizontal scanning line, the target region is the one horizontal scanning line. In this method, whether or not communication of a target region has been performed properly is estimated through verification of the fixed data, instead of detecting an error of image data itself.

3. Second Embodiment

Figure 3:
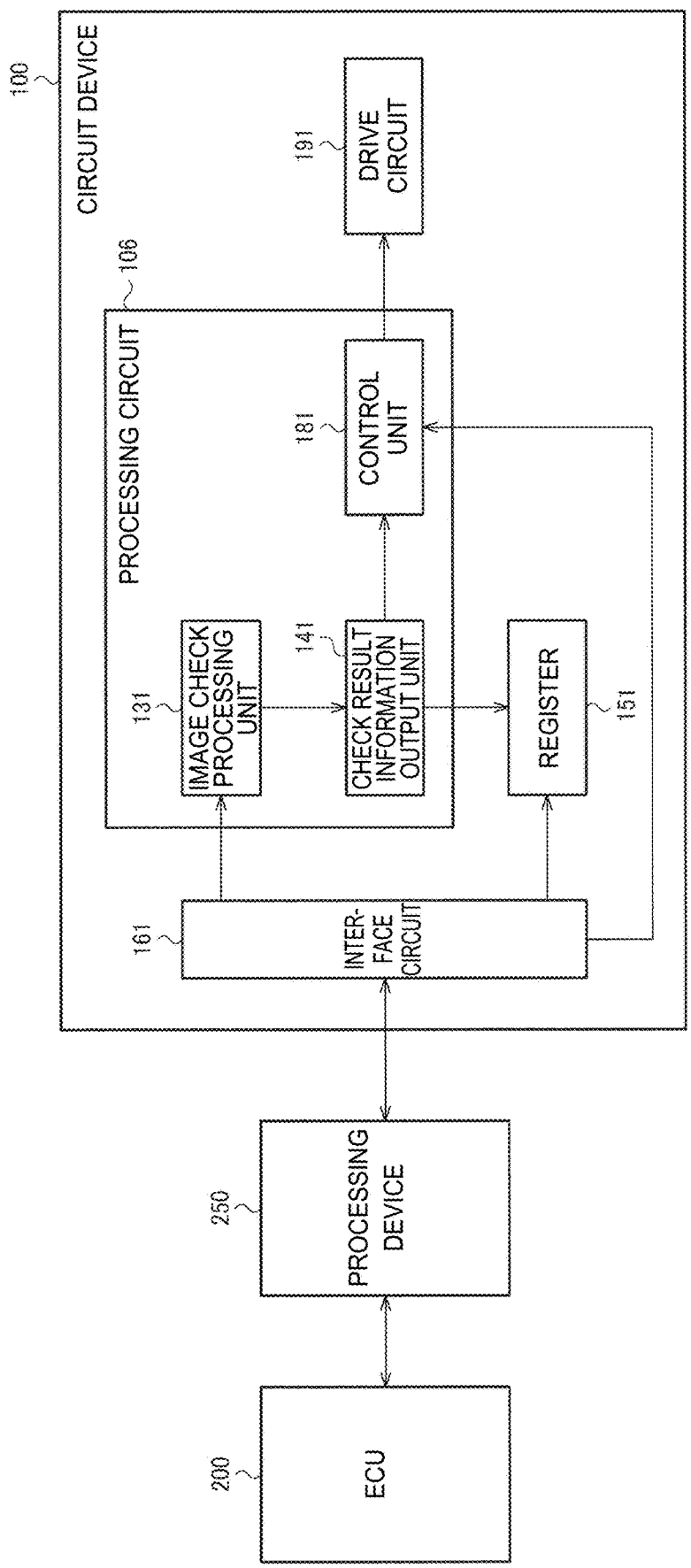
FIG. 3 shows a configuration example of a circuit device in a second embodiment.

FIG. 3 shows a configuration example of a circuit device 100 in a second embodiment. In the second embodiment, the circuit device 100 is a display driver, and a processing device 250 is a display controller. Note that, if the circuit device 100 is installed in an electronic apparatus such as information communication terminal, a processor may be provided in place of the ECU 200.

As shown in FIG. 3, the circuit device 100 includes a processing circuit 106, a register 151, an interface circuit 161, and a drive circuit 191. The processing circuit 105 includes an image check processing unit 131, a check result information output unit 141, and a control unit 181. The circuit device 100 is, for example, an integrated circuit device.

The interface circuit 161, the image check processing unit 131, the check result information output unit 141, and the register 151 can be realized with configurations respectively similar to the interface circuit 160, the image check processing unit 130, the check result information output unit 140, and the register 150 shown in FIG. 2. In addition, the drive circuit 191 corresponds to the above-described data driver and scanning driver.

Accordingly, the processing device 250 transmits image data, a timing control signal, information for image check, and data for image check to the interface circuit 161. The image data and the timing control signal received by the interface circuit 161 are input to the control unit 181. The control unit 181 causes the drive circuit 191 to drive the electro-optical panel based on the image data and the timing control signal.

The image data, the information for image check, and the data for image check received by the interface circuit 161 are input to the image check processing unit 131. The image check processing unit 131 performs image check processing using these. The check result information output unit 141 outputs check result information based on the result of the image check processing. The check result information output unit 141 stores an error detection signal or a calculation value as the check result information to the register 151. The processing device 250 reads out the check result information from the register 151 via the interface circuit 161. Alternatively, the check result information output unit 141 outputs an error detection signal as check result information to the control unit 181. If an error is detected, the control unit 181 stops transfer of the image data to the drive circuit 191, or outputs image data for notifying the error to the drive circuit 191. The image data for notifying the error is image data for presenting a notification of the error to the user, for example.

Note that the circuit device 100 of the second embodiment may further include an image processing unit corresponding to the image processing unit 120 in FIG. 2 and an image memory corresponding to the image memory 115 in FIG. 2. As a result of the circuit device 100 including the image processing unit and the image memory, ECC can be designated as an image check method.

According to the above first and second embodiments, the circuit device 100 includes an interface circuit that receives image data and information for image check, and a processing circuit that performs image check processing. The information for image check includes information for designating an image check method for a region to be subjected to image check and position information of the region to be subjected to image check. The processing circuit performs image check processing on image data of the region to be subjected to image check specified by the position information, using the image check method designated by the designation information.

With such a configuration, an image check method can be designated for each region to be subjected to image check. Specifically, different image check methods can be set for a region that is to be subjected to image check and has a relatively high degree of importance and a region that is to be subjected to image check and has a relatively low degree of importance, from among a plurality of regions to be subjected to image check. Since image check methods can be designated, various image check methods including the CRC method can be designated according to the degree of importance of a region to be subjected to image check, and the like. Accordingly, error correction or accurate error detection can be performed as necessary, and it is possible to reduce the processing load for a region to be subjected to image check in which only simple error detection is required. For example, in CRC, only error detection is performed and error correction cannot be performed. Therefore, measures such as that retransmits image data from the processing device 250 to the circuit device 100 is required, and there is a risk that delay in display and the like occurs. In the present embodiment, by designating ECC for an image that has a high degree of importance, it is possible to perform error correction in the circuit device 100, and display image data that underwent the error correction. On the other hand, the processing load can be reduced by designating a low-load image check method such as checksum or the fixed data method for a region that is to be subjected to image check, and has a relatively low degree of importance, for example.

For example, in an on-board apparatus and the like, in a frame in which an image with a high degree of importance is displayed, a display region of the image is designated as a region to be subjected to image check, and a relatively high-load image check method such as ECC or CRC is designated. With such a configuration, error correction or accurate error detection can be performed on the image with a high degree of importance. Moreover, in a frame in which an image with a high degree of importance is not displayed, a relatively high-load image check such as ECC or CRC is not performed, and thus the processing load is reduced.

In addition, as will be described later with reference to FIG. 4, etc., the interface circuit receives image data, and then receives an expectation value of image check processing. The processing circuit performs image check processing based on the expectation value.

With such a configuration, the processing device 250 can read out image data from the image memory, and calculate an expectation value from the image data in parallel while transmitting the image data to the circuit device 100. It is sufficient that the image data is read out from the image memory only once, and thus it is efficient in terms of memory use and a transmission timing. Here, if the interface circuit receives an expectation value before receiving image data, the processing device 250 is required to read out image data from the image memory, calculate an expectation value from the image data, transmit the expectation value to the circuit device 100, then read out the image data from the image memory again, and transmit the image data to the circuit device 100. Reading out the same image data from the image memory twice in this manner is inefficient. In this regard, in the present embodiment, it suffices for image data to be read out from the image memory only once as described above.

4. Arrangement Examples of Information for Image Check and Data for Image Check Arrangement examples of information for image check and data for image check will be described below.

Figure 4:
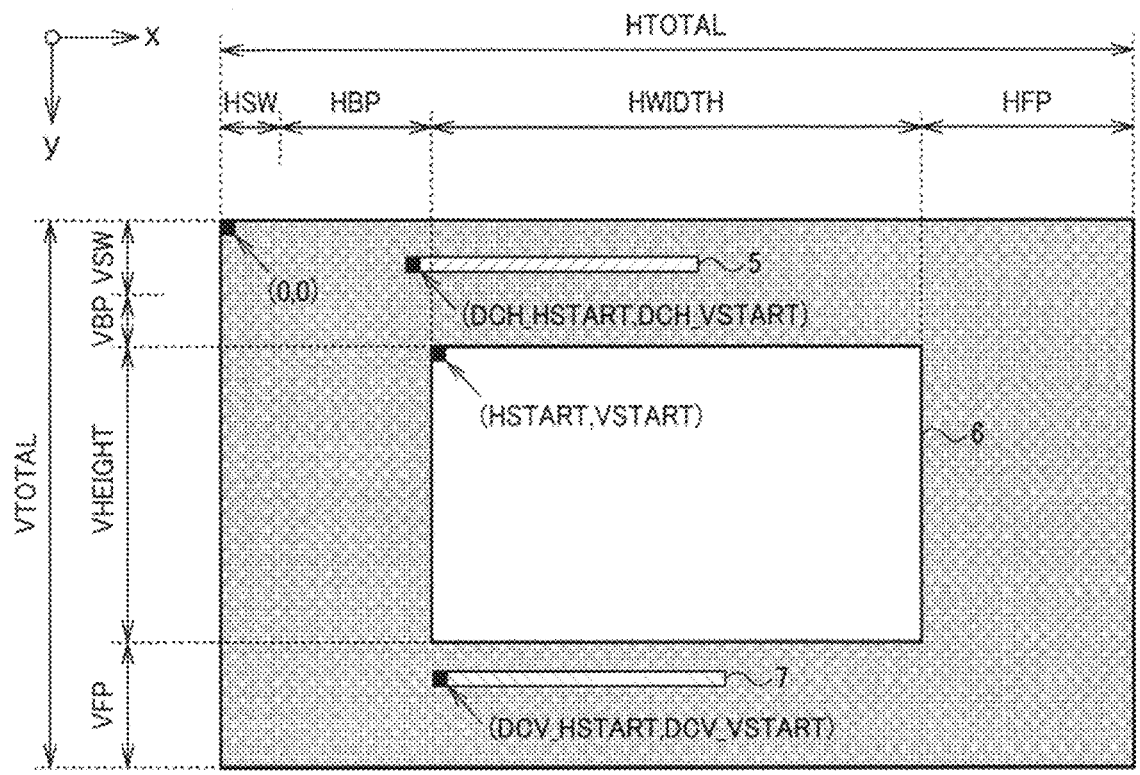
FIG. 4 shows a first arrangement example of information for image check and data for image check.

FIG. 4 shows a first arrangement example of information for image check and data for image check. As shown in FIG. 4, a position in the horizontal scanning direction is indicated by x, and a position in the vertical scanning direction is indicated by y. x and y are integers of 0 or greater. Hereinafter, a direction in which x decreases is also referred to as "left". A direction in which y decreases is also referred to as "upward". FIG. 4 shows data for one frame, and a position (x, y) is defined with the upper-left position of the data being designated as an origin (0, 0).

The data for one frame includes information for image check 5, image data 6, and data for image check 7. A region in which those pieces of data are not arranged is handled as an invalid data region. Accordingly, the circuit device 100 ignores data arranged in such a region as invalid data.

Figure 5:
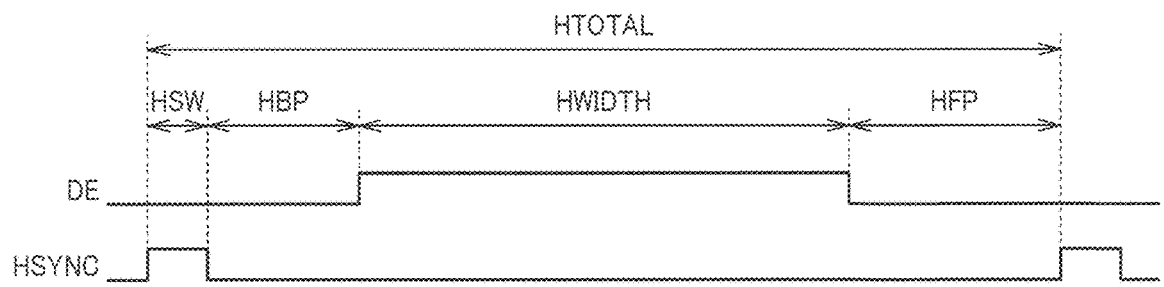
FIG. 5 is a diagram showing the relationship between a horizontal synchronization signal, a data enable signal, and parameters.
Figure 6:
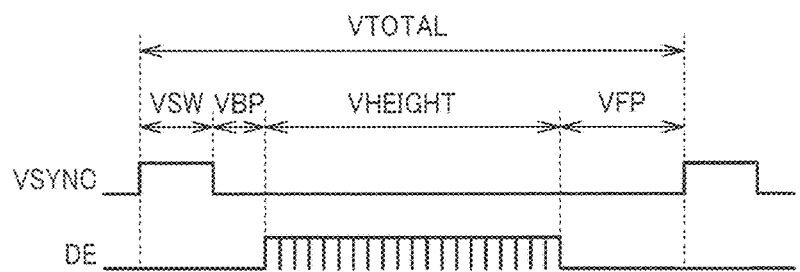
FIG. 6 is a diagram showing the relationship between a vertical synchronization signal, a data enable signal, and parameters.

The size of the data for one frame is designated by parameters HTOTAL and VTOTAL. HTOTAL indicates the number of pixels in the horizontal scanning direction, and VTOTAL indicates the number of pixels in the vertical scanning direction. Specifically, as shown in FIG. 5, the number of pixel clocks from a rising edge of a horizontal synchronization signal HSYNC to the next rising edge is indicated by HTOTAL. One clock of a pixel clock signal corresponds to one pixel. In addition, as shown in FIG. 6, the number of horizontal scanning lines from a rising edge of a vertical synchronization signal VSYNC to the next rising edge is indicated by VTOTAL. The number of pixels in the horizontal scanning direction can be converted into a period by multiplying the cycle of the pixel clock signal. Also, the number of pixels in the vertical scanning direction can be converted into a period by multiplying a horizontal scanning period. In other words, HTOTAL corresponds to a horizontal scanning period, and VTOTAL corresponds to a vertical scanning period.

As shown in FIG. 4, the size of the image data 6 is designated by parameters HWIDTH and VHEIGHT. HWIDTH indicates the number of pixels in the horizontal scanning direction, and VHEIGHT indicates the number of pixels in the vertical scanning direction. Specifically, as shown in FIG. 5, the number of pixel clocks during a period in which a data enable signal DE is at a high level is indicated by HWIDTH. As shown in FIG. 6, the number of horizontal scanning lines since when the data enable signal DE rises for the first time until when the data enable signal DE falls at last, during the vertical scanning period, is indicated by VHEIGHT. During the period corresponding to VHEIGHT, the data enable signal DE in FIG. 5 is repeated for every horizontal scanning period.

As shown in FIG. 4, the position of the image data 6 is designated by (HSTART,VSTART). (HSTART,VSTART) indicates the upper-left pixel position of the region in which the image data 6 is arranged. The arrangement region of the image data 6 is designated by (HSTART,VSTART) and the above HWIDTH and VHEIGHT.

In the first arrangement example, the information for image check 5 is arranged in a vertical blanking period before the image data 6. Here, "before" refers to being earlier in time series in data communication. Accordingly, the processing device 250 sequentially transmits data of horizontal scanning lines of y=0, 1, 2, . . . . In this case, the processing device 250 transmits the information for image check 5 before the image data 6.

The position of the information for image check 5 is designated by (DCH_HSTART,DCH_VSTART). The information for image check 5 is arranged in one line designated by DCH_VSTART. (DCH_HSTART,DCH_VSTART) indicates a pixel position of the left end of the region in which the information for image check 5 is arranged. The length of the arrangement region in the horizontal scanning direction is set to a predetermined length.

In the first arrangement example, the data for image check 7 is arranged during a vertical blanking period after the image data 6. Here, "after" refers to being later in time series in data communication. Accordingly, when the processing device 250 sequentially transmits data of horizontal scanning lines of y=0, 1, 2, . . . , the processing device 250 transmits the data for image check 7 after the image data 6.

The position of the data for image check 7 is designated by (DCV_HSTART,DCV_VSTART). The data for image check 7 is arranged in one line designated by DCV_VSTART. (DCV_HSTART,DCV_VSTART) indicates a pixel position on the left end of the region in which the data for image check 7 is arranged. The length of the arrangement region in the horizontal scanning direction is set to a predetermined length.

Note that, as shown in FIG. 5, parameters HSW, HBP, and HFP correspond to horizontal blanking periods, in other words periods during which the data enable signal DE is at a low level. HSW indicates the number of pixel clocks in a period during which the horizontal synchronization signal HSYNC is at a high level. HBP indicates the number of pixel clocks in a period from a falling edge of the horizontal synchronization signal HSYNC to a rising edge of the data enable signal DE. HFP indicates the number of pixel clocks in a period from a falling edge of the data enable signal DE to a rising edge of the horizontal synchronization signal HSYNC. HBP corresponds to a horizontal back-porch period, and HFP corresponds to a horizontal front-porch period.

In addition, as shown in FIG. 6, parameters VSW, VBP, and VFP correspond to vertical blanking periods, in other words periods in a vertical scanning period during which the data enable signal DE is at a low level. VSW indicates the number of horizontal scanning lines in a period during which the vertical synchronization signal VSYNC is at a high level. VBP indicates the number of horizontal scanning lines from a falling edge of the vertical synchronization signal VSYNC to a rising edge of the data enable signal DE. VFP indicates the number of horizontal scanning lines from a falling edge of the data enable signal DE to a rising edge of the vertical synchronization signal VSYNC. VBP corresponds to a vertical back-porch period, and VFP corresponds to a vertical front-porch period.

The parameters HTOTAL, VTOTAL, HSW, HBP, HWIDTH, HFP, VSW, VBP, VHEIGHT, and VFP are written to the register 150 of the circuit device 100 by the processing device 250. The processing circuit 105 acquires these parameters from the register 150, and acquires the image data 6 based on the parameters. In addition, the parameters DCH_HSTART and DCH_VSTART are written to the register 150 of the circuit device 100 by the processing device 250. The processing circuit 105 acquires these parameters from the register 150, and acquires the information for image check 5 based on the parameters.

In the first arrangement example, a region to be subjected to image check is the entire image data 6. In this case, the information for image check 5 includes information for designating the entire image data 6 as a region to be subjected to image check, information for designating an image check method, and the position (DCV_HSTART, DCV_VSTART) of the data for image check 7. (DCV_HSTART,DCV_VSTART) is storage region designation information for designating a storage region of an expectation value. The image check method is ECC, CRC, checksum, or the fixed data method. The data for image check 7 is an expectation value corresponding to the image check method.

Figure 7:
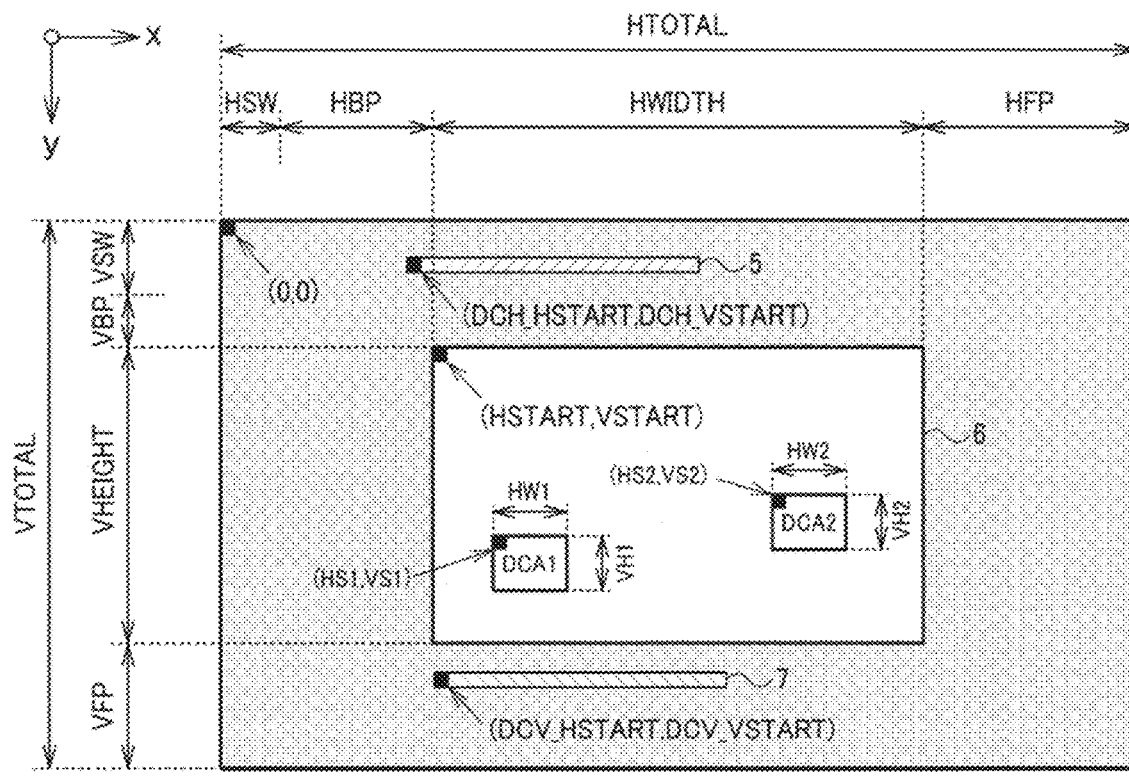
FIG. 7 shows a second arrangement example of information for image check and data for image check.

FIG. 7 shows a second arrangement example of information for image check and data for image check. In the second arrangement example, a plurality of regions to be subjected to image check are arranged in the region of the image data 6. With reference to FIG. 7, a case will be described in which two regions to be subjected to image check are designated, as an example, and it suffices for the number of regions to be subjected to image check is an integer of one or greater. Note that description on the parameters described in the first arrangement example is omitted.

Similarly to the first arrangement example, the information for image check 5 is arranged during a vertical blanking period before the image data 6. In addition, the data for image check 7 is arrange during a vertical blanking period after the image data 6.

A first region DCA1 to be subjected to image check and a second region DCA2 to be subjected to image check are arranged in the region of the image data 6. The size of the first region DCA1 to be subjected to image check is designated by parameters HW1 and VH1. The size of the second region DCA2 to be subjected to image check is designated by parameters HW2 and VH2. HW1 and HW2 each indicate the number of pixels in the horizontal scanning direction, VH1 and VH2 each indicate the number of pixels in the vertical scanning direction. The position of the first region DCA1 to be subjected to image check is designated by (HS1,VS1). (HS1,VS1) indicates an upper-left pixel position of the first region DCA1 to be subjected to image check. The position of the second region DCA2 to be subjected to image check is designated by (HS2,VS2). (HS2,VS2) indicates an upper-left pixel position of the second region DCA2 to be subjected to image check.

The information for image check 5 includes the position of the data for image check 7 (DCV_HSTART, DCV_VSTART). In addition, the information for image check 5 includes the parameters HW1, VH1, and (HS1,VS1) for designating the first region DCA1 to be subjected to image check, information for designating a first image check method for the first region DCA1 to be subjected to image check, and a first expectation value used for image check processing of the first region DCA1 to be subjected to image check. (HS1,VS1) is first position information for designating the position of the first region DCA1 to be subjected to image check. In addition, the information for image check 5 includes the parameters HW2, VH2, and (HS2,VS2) for designating the second region DCA2 to be subjected to image check, information for designating a second image check method for the second region DCA2 to be subjected to image check, and a second expectation value used for image check processing of the second region DCA2 to be subjected to image check. (HS2,VS2) is second position information for designating the position of the second region DCA2 to be subjected to image check. The first image check method and the second image check method are selected from a plurality of image check methods. Specifically, the first image check method is any one of ECC, CRC, checksum, and the fixed data method. The second image check method is any one of ECC, CRC, checksum, and the fixed data method. The first image check method and the second image check method may be different or the same.

For example, a first icon is displayed in the first region DCA1 to be subjected to image check, and a second icon is displayed in the second region DCA2 to be subjected to image check. In this case, the processing device 250 transmits the image data 6 of a display image that includes the first icon and the second icon, to the circuit device 100. A method corresponding to the degree of importance of the first icon is designated as the first image check method, and a method corresponding to the degree of importance of the second icon is designated as the second image check method. With such a configuration, image check can be performed on image data of a region to be subjected to image check that includes an icon, using an image check method corresponding to the degree of importance of the icon.

Figure 8:
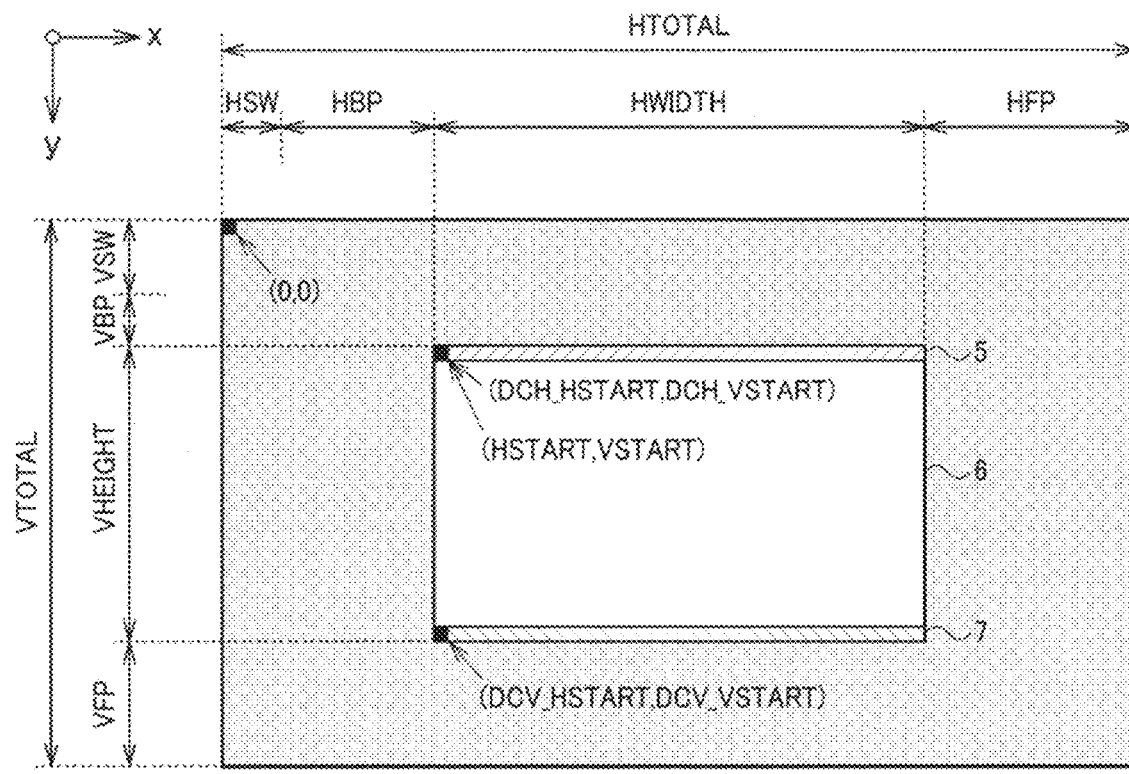
FIG. 8 shows a third arrangement example of information for image check and data for image check.

FIG. 8 shows a third arrangement example of information for image check and data for image check. In the third arrangement example, the information for image check 5 and the data for image check 7 are transferred during a data enable period instead of a blanking period. With reference to FIG. 8, a case will be described in which a region to be subjected to image check is the entire image data 6, as an example, but a plurality of regions to be subjected to image check may also be designated similar to FIG. 7. Note that description on the parameters described in the first arrangement example is omitted.

In the third arrangement example, the processing device 250 transmits the information for image check 5, the image data 6, and the data for image check 7 to the circuit device 100 during a data enable period during which the data enable signal DE is at a high level. The information for image check 5 is transmitted before the image data 6, and the data for image check 7 is transmitted after the image data 6.

The position of the information for image check 5 is designated by (DCH_HSTART,DCH_VSTART). DCH_HSTART is equal to HSTART, and DCH_VSTART is equal to VSTART. The position of the data for image check 7 is designated by (DCV_HSTART,DCV_VSTART). The size of the image data 6 is designated by HWIDTH and VHEIGHT, and the position is designated by (HSTART, VSTART). The processing device 250 obtains the actual size and position of the image data 6 based on these parameters. For example, if the information for image check 5 and the data for image check 7 are each composed of one line, the number of pixels of the image data 6 in the vertical scanning direction is indicated by VHEIGHT−2, and the position of the image data 6 is (HSTART,VSTART+1).

The content of the information for image check 5 and the content of the data for image check 7 are similar to the first arrangement example or the second arrangement example.

Figure 9:
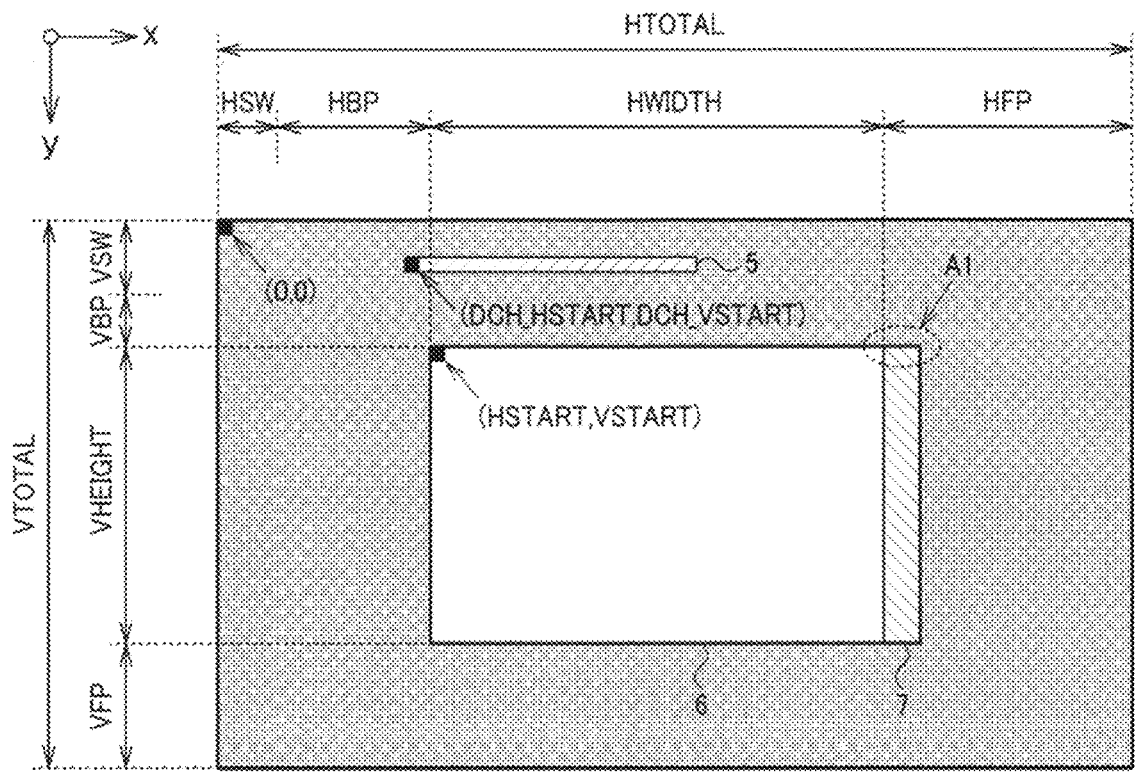
FIG. 9 shows a fourth arrangement example of information for image check and data for image check.

FIG. 9 shows a fourth arrangement example of information for image check and data for image check. In the fourth arrangement example, a region to be subjected to image check is a horizontal scanning line, and the data for image check 7 is arranged during a horizontal blanking period. Note that description on the parameters described in the first arrangement example is omitted.

Similarly to the first arrangement example, the information for image check 5 is arranged in a vertical blanking period before the image data 6. The position of the information for image check 5 is designated by (DCH_HSTART, DCH_VSTART).

The size of the image data 6 is designated by parameters HWIDTH and VHEIGHT. In addition, the position of the image data 6 is designated by (HSTART, VSTART). The image data 6 is transferred from the processing device 250 to the circuit device 100 during a data enable period.

Figure 10:
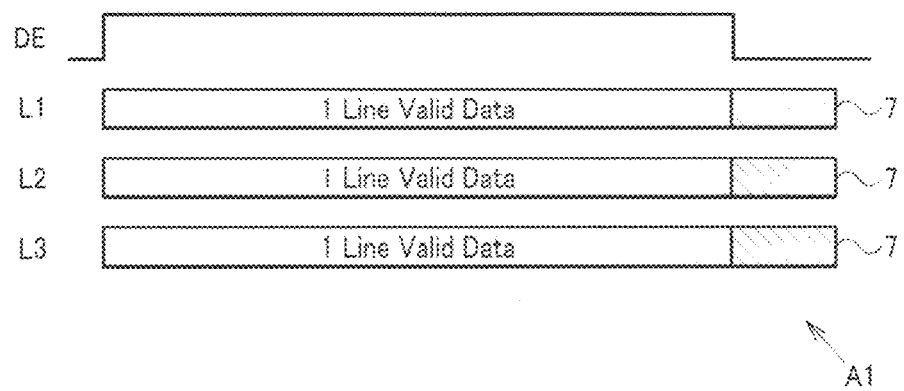
FIG. 10 is a diagram showing image data for three lines and data for image check in the fourth arrangement example.

In each horizontal scanning line, the data for image check 7 is arranged in a horizontal blanking period after the image data. Specifically, the data for image check 7 is arranged in a horizontal front-porch period. FIG. 10 shows image data for three lines and data for image check indicated by reference sign A1 in FIG. 9. L1, L2, and L3 respectively indicate horizontal scanning lines (y=VSTART, VSTART+1, and VSTART+2). During a period during which the data enable signal DE is at a high level, image data of the horizontal scanning line L1 is transferred from the processing device 250 to the circuit device 100. An expectation value that is used for image check processing on the image data of the horizontal scanning line L1 is transferred immediately after the image data of the horizontal scanning line L1, in other words a falling of the data enable signal DE. The size of the region in which the expectation value is arranged is defined by the number of pixel clocks. The number of pixel clocks is designated by the information for image check 5, or is set to a predetermined number. Similarly, image data of each of the horizontal scanning lines L2 and L3 is transferred during a period during which the data enable signal DE is at a high level, and an expectation value is transferred upon the data enable signal DE falling.

The information for image check 5 includes information for designating horizontal scanning lines as a region to be subjected to image check, information for designating an image check method, and information for designating addition of the data for image check 7 to the end of each horizontal scanning line. The information for designating addition of the data for image check 7 to the end of each horizontal scanning line is storage region designation information for designating a storage region of an expectation value. This information is not expressed as a position (x,y), and is a code value that indicates the storage region, or the like. The image check method may be ECC, CRC, checksum, or the fixed data method. If the image check method is ECC, CRC, or checksum, the expectation value is calculated from image data of each horizontal scanning line, which is a region to be subjected to image check. If the image check method is the fixed data method, the expectation value is fixed data. For example, the same fixed data is used for each horizontal scanning line.

Note that, in the fourth arrangement example, the regions DCA1 and DCA2 to be subjected to image check as shown in FIG. 7 may further be designated. In horizontal scanning lines in which the region DCA1 to be subjected to image check is arranged, expectation values can include expectation values corresponding to image data of the horizontal scanning lines and expectation values corresponding to image data of the region DCA1 to be subjected to image check. The same applies to the region DCA2 to be subjected to image check.

Figure 11:
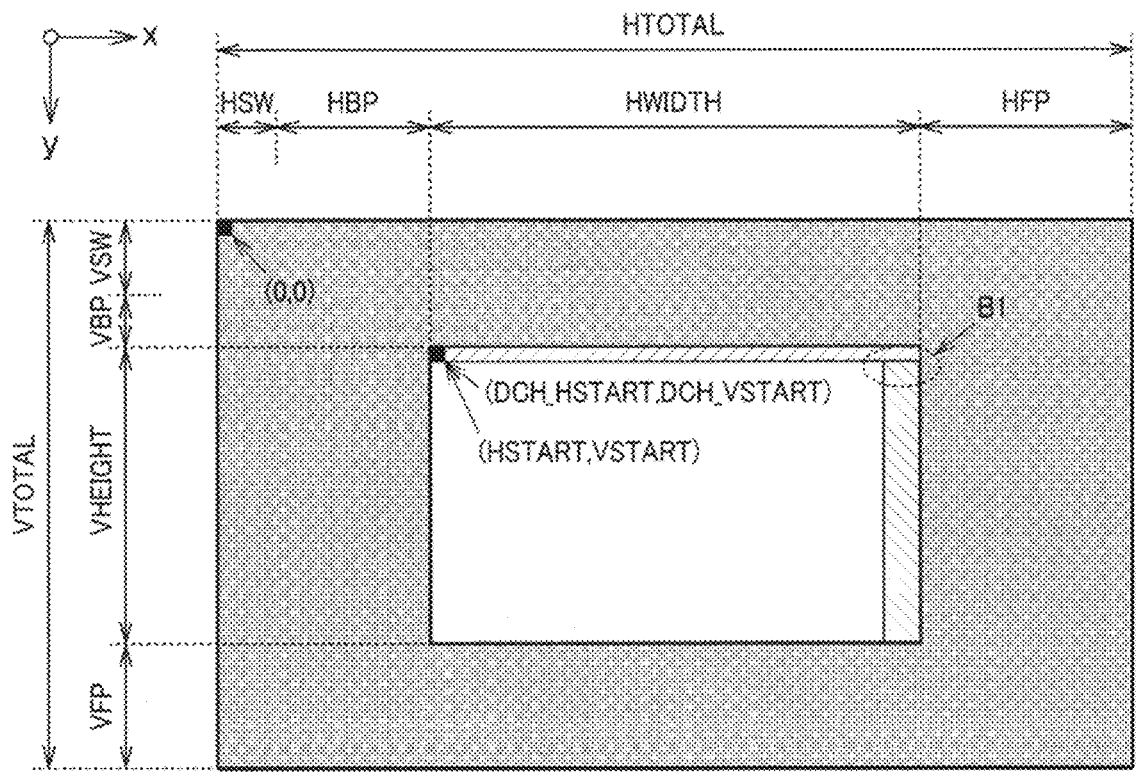
FIG. 11 shows a fifth arrangement example of information for image check and data for image check.

FIG. 11 shows a fifth arrangement example of information for image check and data for image check. In the fifth arrangement example, the information for image check 5 and the data for image check 7 are transferred during data enable periods instead of blanking periods. Note that description on the parameters described in the first arrangement example is omitted.

In the fifth arrangement example, the processing device 250 transmits the information for image check 5, the image data 6, and the data for image check 7 to the circuit device 100 during data enable periods during which the data enable signal DE is at a high level.

The information for image check 5 is transmitted before the image data 6. The position of the information for image check 5 is designated by (DCH_HSTART,DCH_VSTART). DCH_HSTART is equal to HSTART, and DCH_VSTART is equal to VSTART. The size of the image data 6 is designated by HWIDTH and VHEIGHT, and the position is designated by (HSTART,VSTART). The processing device 250 obtains the actual size and position of the image data 6 based on these parameters. For example, assume that the information for image check 5 is composed of one line, and the number of pixels in the arrangement region of the data for image check 7 in the horizontal scanning direction is DCV_HW. In this case, the number of pixels of the image data 6 in the horizontal scanning direction is HWIDTH-DCV_HW, and the number of pixels of the image data 6 in the vertical scanning direction is VHEIGHT−1. The position of the image data 6 is (HSTART, VSTART+1).

Figure 12:
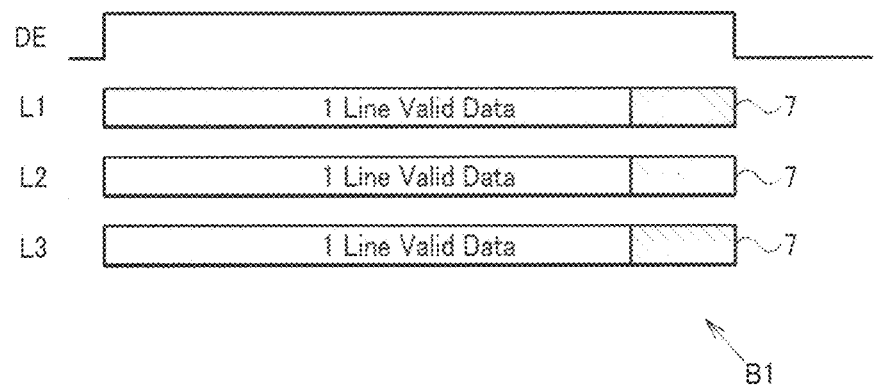
FIG. 12 is a diagram showing image data for three lines and data for image check in the fifth arrangement example.

FIG. 12 shows image data for three lines and data for image check indicated by reference sign B1 in FIG. 11. L1, L2, and L3 respectively indicate horizontal scanning lines (y=VSTART+1, VSTART+2, and VSTART+3). During a period during which the data enable signal DE is at a high level, image data and an expectation value of the horizontal scanning line L1 are transferred from the processing device 250 to the circuit device 100. The expectation value is used for image check processing of the image data of the horizontal scanning line L1. Similarly, image data and an expectation value of each of the horizontal scanning lines L2 and L3 are transferred during a period during which the data enable signal DE is at a high level.

5. Processing Device

Figure 13:
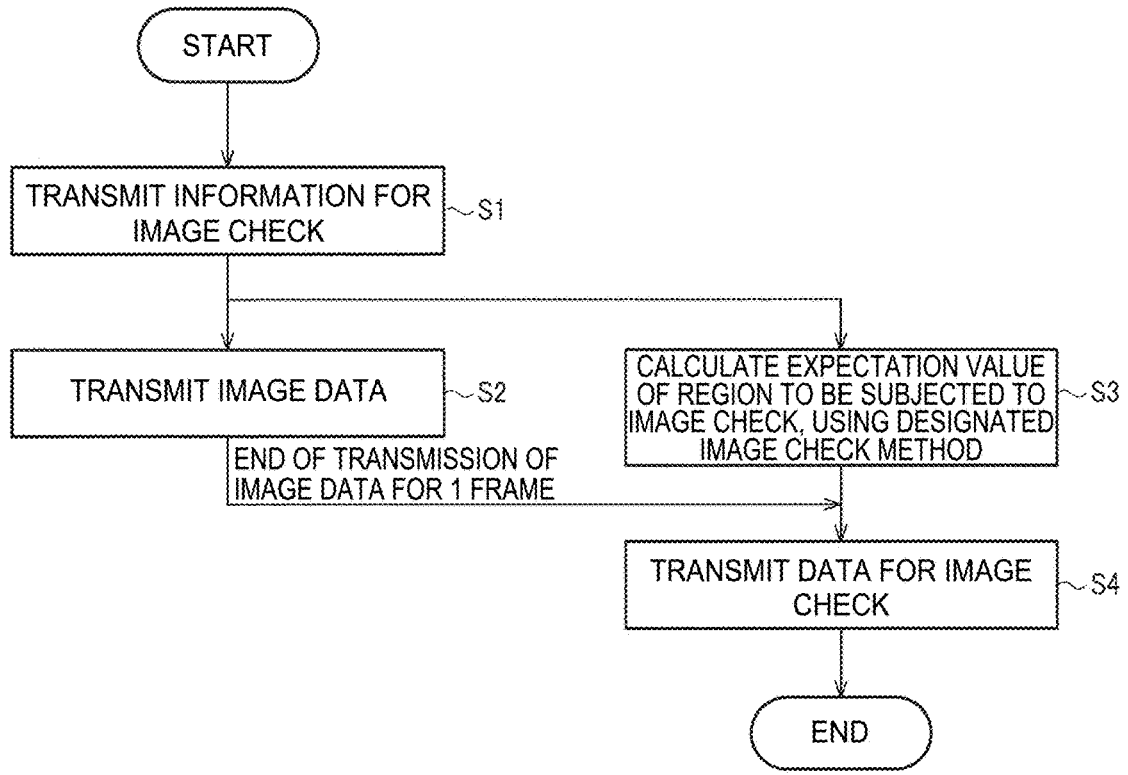
FIG. 13 is a first flowchart of processing that is performed by a processing device.

FIG. 13 is a first flowchart of processing that is performed by the processing device 250. FIG. 13 is a flowchart of a case where data for image check is transmitted after the image data 6 is transmitted. Accordingly, FIG. 13 is a flowchart for the arrangement examples in FIGS. 4, 7, and 8.

In step S1, the processing device 250 transmits information for image check to the circuit device 100. The information for image check includes information for designating a region to be subjected to image check, information for designating an image check method that is applied to the region to be subjected to image check, and position information of data for image check.

In step S2, the processing device 250 reads out image data from the image memory, and transmits the image data to the circuit device 100.

In step S3, the processing device 250 calculates an expectation value of image data of the region to be subjected to image check, out of the image data read out in step S2. The expectation value is calculated using the image check method designated by the information for image check in step S1. The processing in step S3 is performed in parallel with the processing in step S2.

In step S4, the processing device 250 transmits the expectation value calculated in step S3, as the data for image check to the circuit device 100. After image data for one frame is transmitted in step S2, the processing in step S4 is executed.

Figure 14:
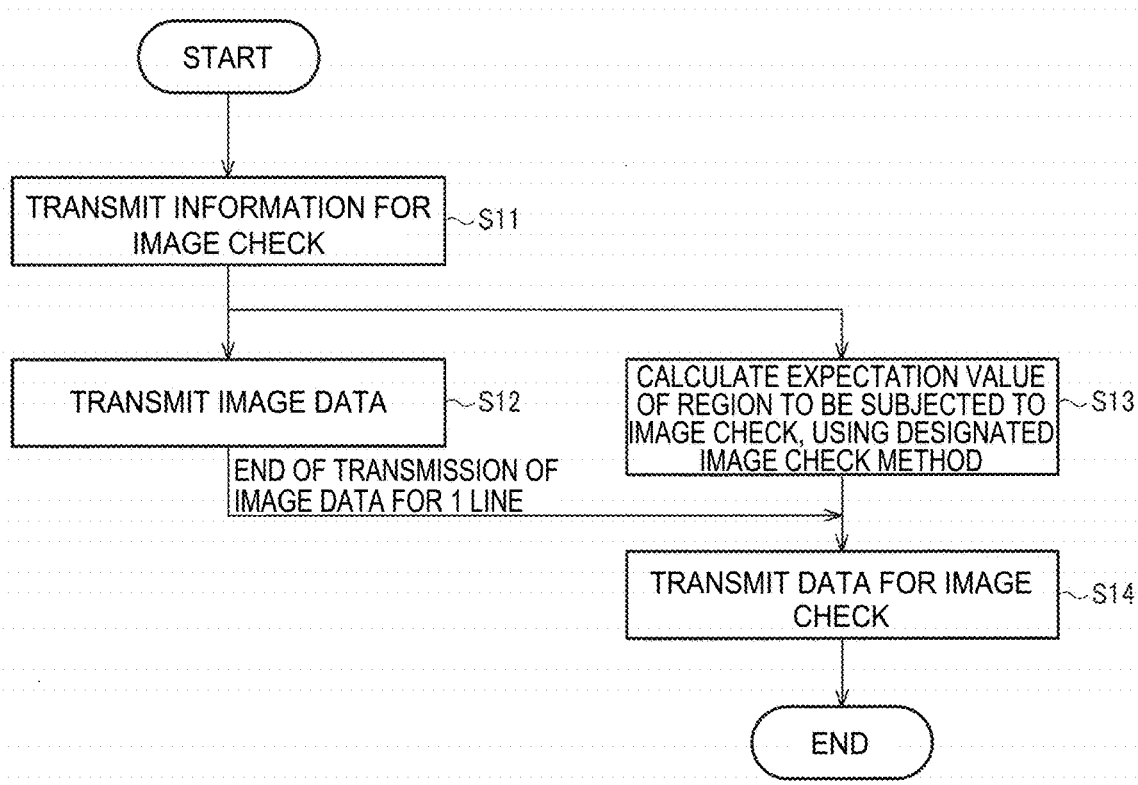
FIG. 14 is a second flowchart of processing that is performed by the processing device.

FIG. 14 is a second flowchart of processing that is performed by the processing device 250. FIG. 14 is a flowchart of a case where data for image check is transmitted for each horizontal scanning line. Accordingly, FIG. 14 is a flowchart corresponding to the arrangement examples in FIGS. 9 and 11.

In step S11, the processing device 250 transmits information for image check to the circuit device 100. The information for image check includes information for designating a region to be subjected to image check, information for designating an image check method that is applied to the region to be subjected to image check, and position information of data for image check.

In step S12, the processing device 250 reads out image data for one line from the image memory, and transmits the image data for one line to the circuit device 100.

In step S13, the processing device 250 calculates an expectation value from the image data for one line read out in step S12. The expectation value is calculated using the image check method designated by the information for image check in step S11. The processing in step S13 is performed in parallel with the processing in step S12.

In step S14, the processing device 250 transmits the expectation value calculated in step S13, as the data for image check to the circuit device 100. After the image data for one line is transmitted in step S12, the processing in step S14 is executed. The processing device 250 performs the processes in step S11 to S14 for each horizontal scanning line.

6. Electronic Apparatus and Mobile Unit

Figure 15:
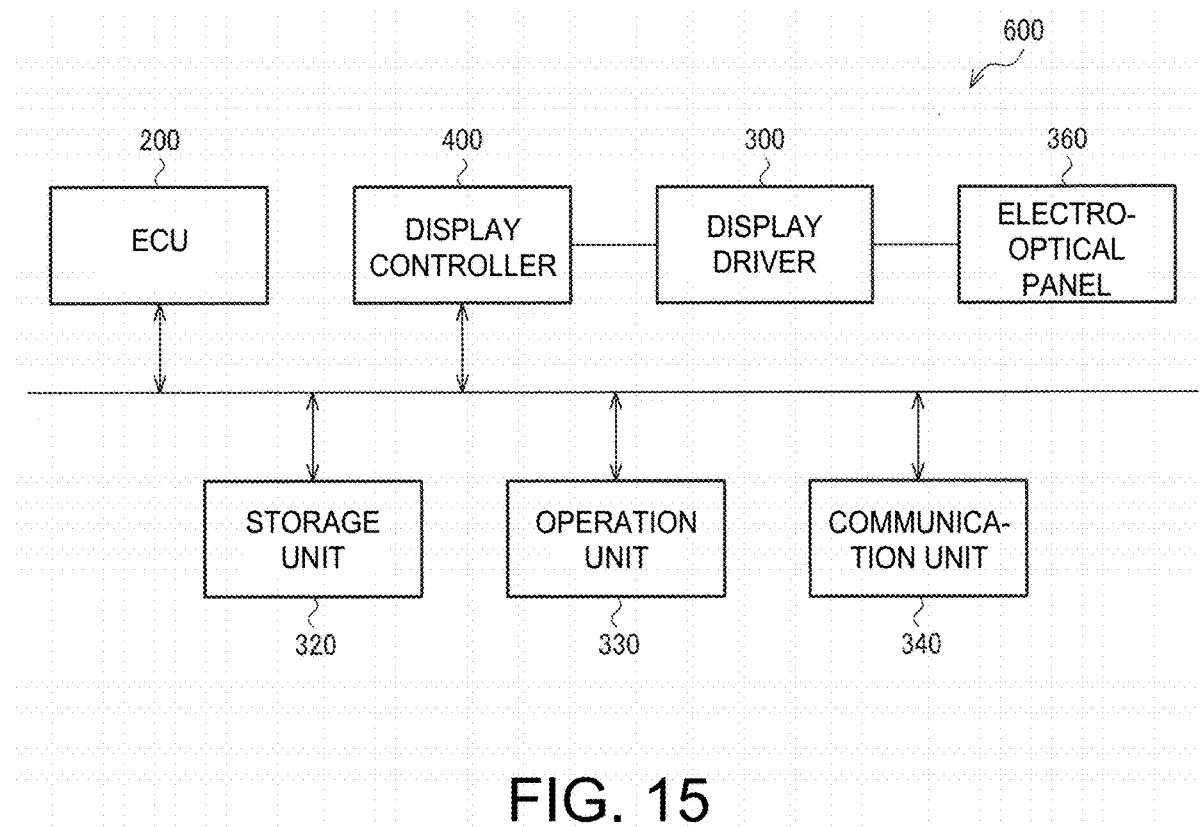
FIG. 15 shows a configuration example of an electronic apparatus.

FIG. 15 shows a configuration example of an electronic apparatus that includes the circuit device of the present embodiment. The electronic apparatus of the present embodiment may be any of various electronic apparatuses equipped with a display device. For example, the electronic apparatus of the present embodiment may be an on-board display device (e.g., a meter panel), a display, a projector, a television device, an information processing device, a portable information terminal, a car navigation system, a portable game terminal, a DLP (digital light processing) device, or the like. The on-board display device is a meter panel or the like.

An electronic apparatus 600 includes the ECU 200, the display controller 400, the display driver 300, the electro-optical panel 360, a storage unit 320, an operation unit 330, and a communication unit 340. The circuit device of the present embodiment is installed as the display controller 400 or the display driver 300 in the electronic apparatus. Note that the storage unit 320 is a storage device or a memory. The operation unit 330 is an operation device. The communication unit 340 is a communication device.

The operation unit 330 is a user interface that receives various operations from the user. The operation unit 330 may be composed of, for example, buttons, a mouse, a keyboard, and a touch panel attached to the electro-optical panel 360. The communication unit 340 is a data interface that communicates image data and control data. The communication unit 340 is, for example, a wired communication interface such as a USB or a wireless communication interface such as a wireless LAN. The storage unit 320 stores image data that has been input from the communication unit 340. Alternatively, the storage unit 320 functions as a working memory of the ECU 200. The ECU 200 performs control processing of the units of the electronic apparatus and various types of data processing. The display controller 400 performs control processing of the display driver 300. For example, the display controller 400 converts image data transferred from the communication unit 340 or the storage unit 320 via the ECU 200, into a format that can be accepted in the display driver 300, and outputs the converted image data to the display driver 300. The display driver 300 drives the electro-optical panel 360 based on the image data transferred from the display controller 400.

Figure 16:
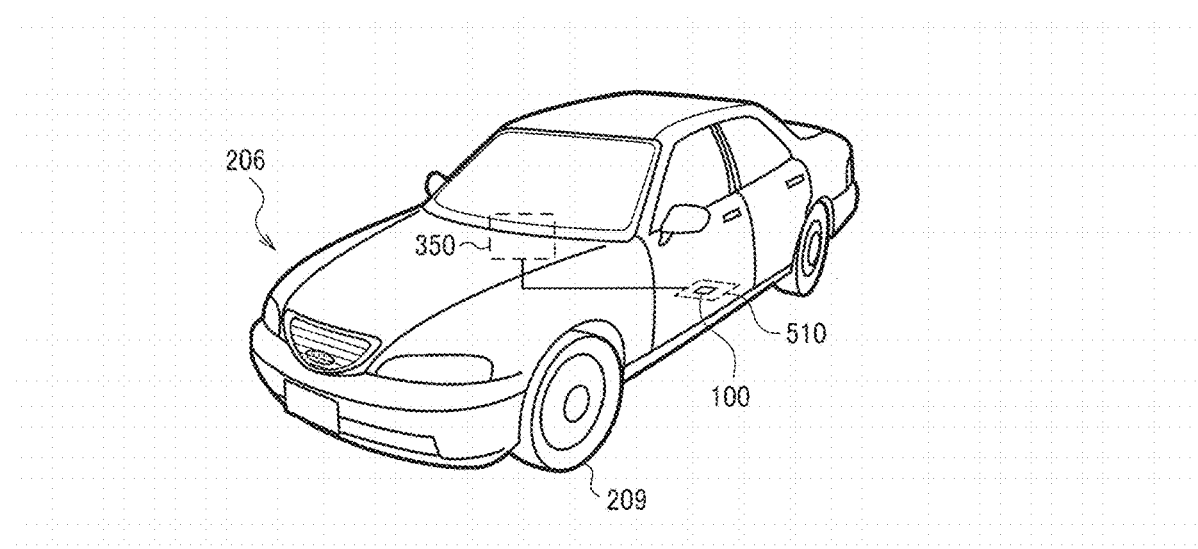
FIG. 16 shows an example of a mobile unit.

FIG. 16 shows a configuration example of a mobile unit that includes the circuit device according to the present embodiment. The mobile unit is a device or an apparatus that moves on ground, in the air, or on sea, and includes, for example, a driving mechanism such as an engine or a motor, a steering mechanism such as a steering wheel or a rudder, and various types of electronic apparatuses. The mobile unit according to the present embodiment may be, for example, any of various mobile units such as a vehicle, an aircraft, a motorcycle, a marine vessel, a running robot, and a walking robot. FIG. 16 schematically shows an automobile 206 that is a specific example of the mobile unit. The automobile 206 includes a display device 350 and a control device 510 that controls the units of the automobile 206. The circuit device 100 of the present embodiment is implemented on the substrate of a control device 510, for example. Alternatively, the circuit device 100 of the present embodiment may be included in the display device 350. The control device 510 generates an image for presenting, to the user, information such as a vehicle speed, a fuel residual amount, a running distance, and settings of various devoces, transmits the image to the display device 350, and displays the image on the electro-optical panel 360.

According to the above embodiments, the circuit device includes an interface circuit that receives image data and information for image check, and a processing circuit that performs image check processing. The information for image check includes information for designating an image check method for a region to be subjected to image check and position information of the region to be subjected to image check. The processing circuit performs the image check processing on the image data of the region to be subjected to image check specified by the position information, using the image check method designated by the designation information.

With such a configuration, an image check method can be designated for a region to be subjected to image check. For example, different image check methods can be set for a region that is to be subjected to image check and has a relatively high degree of importance and a region that is to be subjected to image check and has a relatively low degree of importance, from among a plurality of regions to be subjected to image check. Since an image check method can be designated, any of various image check methods including a CRC method can be designated according to the degree of importance of a region to be subjected to image check, and the like. Accordingly, error correction or accurate error detection can be performed as necessary, and it is possible to reduce the processing load for a region to be subjected to image check in which only simple error detection is required.

In addition, in the present embodiment, the interface circuit may receive an expectation value of the image check processing after receiving the image data. The processing circuit may perform the image check processing based on the expectation value.

With such a configuration, the processing device can read out image data from the image memory, and calculate an expectation value from the image data while transmitting the image data to the circuit device in parallel. It is sufficient that the image data is read out from the image memory only once, and thus it is efficient in terms of memory use and transmission timing.

In addition, in the present embodiment, the interface circuit may receive an expectation value of the image check processing during a horizontal blanking period of the image data. The processing circuit may perform the image check processing based on the expectation value.

With such a configuration, the expectation value that is used when performing image check processing on image data of a horizontal scanning line can be received by the circuit device during a horizontal blanking period of that horizontal scanning line. In other words, a region that is subjected to image check processing using the expectation value can be set to the horizontal scanning line. Accordingly, image data can be checked in each horizontal scanning line.

In addition, in the present embodiment, the interface circuit may receive fixed data as the expectation value. The processing circuit may perform the image check processing by comparing the expectation value with comparison data corresponding to the fixed data.

With such a configuration, the processing device does not need to calculate an expectation value from image data, and the processing circuit of the circuit device also does not need to calculate comparison data from the image data. Since such a fixed data method can be designated, it is possible to reduce the load of image check processing that is performed by the processing device and the circuit device.

In addition, in the present embodiment, the image check method may be ECC, CRC, checksum, or a fixed data method in which fixed data is used to perform the image check processing.

Since a plurality of image check methods can be selected as described above, an appropriate image check method can be designated for a region to be subjected to image check. For example, by designating ECC for a region that is to be subjected to image check and has a high degree of importance, the circuit device can perform error correction, and output image data that underwent the error correction. On the other hand, for example, the processing load can be reduced by designating a low-load image check method such as checksum or the fixed data method for a region that is to be subjected to image check and has a low degree of importance.

In addition, in the present embodiment, the information for image check may include information regarding a first image check method for a first region to be subjected to image check, first position information of the first region to be subjected to image check, information regarding a second image check method for a second region to be subjected to image check, and second position information of the second region to be subjected to image check. The processing circuit may perform image check on the image data of the first region to be subjected to image check, using the first image check method, and perform image check on the image data of the second region to be subjected to image check, using the second image check method.

With such a configuration, the processing circuit can perform image check processing on the image data of the first region to be subjected to image check designated by the first position information, using the first image check method. The processing circuit can also perform image check processing on the image data of the second region to be subjected to image check designated by the second position information, using the second image check method. In other words, the processing circuit can perform image check processing on a plurality of regions to be subjected to image check, using image check methods respectively designated for the regions to be subjected to image check.

In addition, in the present embodiment, the interface circuit may receive the image data of a display image that includes a first icon and a second icon. The information for image check may include information regarding a first image check method for a first region to be subjected to image check corresponding to the first icon, first position information of the first region to be subjected to image check, information regarding a second image check method for a second region to be subjected to image check corresponding to the second icon, and second position information of the second region to be subjected to image check. The processing circuit may perform image check on the image data of the first region to be subjected to image check, using the first image check method, and perform image check on the image data of the second region to be subjected to image check, using the second image check method.

With such a configuration, the processing circuit can perform image check processing on the image data of the first region to be subjected to image check that includes the first icon, using the first image check method. Also, the processing circuit can perform image check processing on the image data of the second region to be subjected to image check that includes the second icon, using the second image check method. Accordingly, the processing circuit can perform image check processing on an icon, using an image check method that is based on the degree of importance of the icon.

In addition, in the present embodiment, the first image check method and the second image check method may be selected from the above-described image check methods. Specifically, the first image check method is any one of ECC, CRC, checksum, and the fixed data method, and the second image check method is any one of ECC, CRC, checksum, and the fixed data method. The first image check method and the second image check method may be different or the same.

With such a configuration, any image check method can be designated from a plurality of image check methods, for each region to be subjected to image check. Accordingly, an appropriate image check method can be designated for the region to be subjected to image check.

In addition, in the present embodiment, the first image check method may be ECC, and the second image check method may be CRC or checksum.

With such a configuration, error correction can be performed on the image data of the first region to be subjected to image check. On the other hand, error detection can be performed on the image data of the second region to be subjected to image check, and the processing load can be reduced compared to ECC.

In addition, in the present embodiment, the first image check method may be CRC, and the second image check method may be checksum.

With such a configuration, error detection can be performed on the image data of the first region to be subjected to image check, using CRC. On the other hand, error detection can be performed on the image data of the second region to be subjected to image check, using checksum, and the processing load is reduced compared to CRC.

In addition, in the present embodiment, the interface circuit may receive storage region designation information for designating a storage region of the expectation value, as the information for image check. The processing circuit may acquire the expectation value from the storage region designated by the storage region designation information.

The storage region designation information is information indicating a region in data for one frame in which the expectation value is stored. For example, the storage region designation information is information indicating the size and position of the region, information indicating that the expectation value is arranged in a predetermined region, or the like. The predetermined region is a data region added to the end of image data of a horizontal scanning line, or the like. The interface circuit receives the information for image check that includes the storage region designation information, and thereby the processing circuit can acquire the expectation value based on the storage region designation information.

Also, in the present embodiment, a display control system includes the circuit device according to any one of the aspects described above, and a processing device that transmits information for image check and image data to the circuit device.

Also, in the present embodiment, an electronic apparatus includes the circuit device according to any one of the aspects described above.

Also, in the present embodiment, a mobile unit includes the circuit device according to any one of the aspects described above.

The embodiments according to the disclosure have been described in detail above, but those skilled in the art will readily understand that various modifications can be made from new matter and effects of the disclosure without departing from the gist of the disclosures. Accordingly, all of such modifications are also encompassed in the scope of the disclosure. For example, a term described together with a different term having a broader meaning or the same meaning at least once in the specification or drawings may be replaced by the different term anywhere in the specification or drawings. Also, all combinations of the embodiments and variations of the disclosure are also encompassed in the scope of the disclosure. In addition, the configurations and operations of the circuit device, the display control system, the electronic apparatus, and the mobile unit are not limited to those described in the embodiments of the disclosure, and various modifications can be made thereto.

What is claimed is:

1. A circuit device comprising:
an interface circuit that receives image data and information for image check associated with the image data; and
a processing circuit, which is in communication with the interface circuit, that performs image check processing on the image data received by the interface circuit and based on the information for image check associated with the image data received by the interface circuit,
wherein the information for image check includes:
information for designating an image check method for a region to be subjected to image check, the image check method being selected from one of a plurality of image check methods, and position information of the region to be subjected to image check, and
the processing circuit performs the image check processing on the image data of the region to be subjected to image check specified by the position information, using the image check method designated by the designation information, and
wherein the image check method is selected from the one of the plurality of image check methods in accordance with the region to be subjected to image check of the image data.

2. The circuit device according to claim 1,
wherein the interface circuit receives an expectation value of the image check processing after receiving the image data, and
the processing circuit performs the image check processing based on the expectation value.

3. The circuit device according to claim 2,
wherein the interface circuit receives storage region designation information for designating a storage region of the expectation value, as the information for image check, and
the processing circuit acquires the expectation value from the storage region designated by the storage region designation information.

4. The circuit device according to claim 1,
wherein the interface circuit receives an expectation value of the image check processing during a horizontal blanking period of the image data, and
the processing circuit performs the image check processing based on the expectation value.

5. The circuit device according to claim 4,
wherein the interface circuit receives fixed data as the expectation value, and
the processing circuit performs the image check processing by comparing the expectation value with comparison data corresponding to the fixed data.

6. The circuit device according claim 1,
wherein the image check method is ECC, CRC, checksum, or a fixed data method in which fixed data is used to perform the image check processing.

7. The circuit device according to claim 1,
wherein the information for image check includes:
information regarding a first image check method for a first region to be subjected to image check, first position information of the first region to be subjected to image check, information regarding a second image check method for a second region to be subjected to image check, and second position information of the second region to be subjected to image check, and
the processing circuit performs image check on the image data of the first region to be subjected to image check, using the first image check method, and performs image check on the image data of the second region to be subjected to image check, using the second image check method.

8. The circuit device according to claim 7,
wherein the first image check method and the second image check method are selected from the image check methods.

9. The circuit device according to claim 7,
wherein the first image check method is ECC, and the second image check method is CRC or checksum.

10. The circuit device according to claim 7,
wherein the first image check method is CRC, and
the second image check method is checksum.

11. The circuit device according to claim 1,
wherein the interface circuit receives the image data of a display image that includes a first icon and a second icon,
the information for image check includes information regarding a first image check method for a first region to be subjected to image check corresponding to the first icon, first position information of the first region to be subjected to image check, information regarding a second image check method for a second region to be subjected to image check corresponding to the second icon, and second position information of the second region to be subjected to image check, and
the processing circuit performs image check on the image data of the first region to be subjected to image check, using the first image check method, and performs image check on the image data of the second region to be subjected to image check, using the second image check method.

12. A display control system comprising:
the circuit device according to claim 1; and
a processing device that transmits the information for image check and the image data to the circuit device.

13. An electronic apparatus comprising:
the circuit device according to claim 1.

14. A mobile unit comprising:
the circuit device according to claim 1.

15. The circuit device according to claim 1,
wherein the image check method is selected from the one of the plurality of image check methods in accordance with a degree of importance of the region to be subjected to image check of the image data.

16. A circuit device comprising:
an interface circuit that receives image data and information for image check; and
a processing circuit that performs image check processing,
wherein the information for image check includes:
information for designating an image check method for a region to be subjected to image check and position information of the region to be subjected to image check, and
the processing circuit performs the image check processing on the image data of the region to be subjected to image check specified by the position information, using the image check method designated by the designation information, and
wherein the interface circuit receives an expectation value of the image check processing during a horizontal blanking period of the image data, and
the processing circuit performs the image check processing based on the expectation value.

17. The circuit device according to claim 16,
wherein the interface circuit receives fixed data as the expectation value, and
the processing circuit performs the image check processing by comparing the expectation value with comparison data corresponding to the fixed data.

* * * * *